(12) United States Patent
Ryu et al.

(10) Patent No.: US 7,026,497 B2
(45) Date of Patent: Apr. 11, 2006

(54) ADHESIVE COMPOUND AND METHOD FOR FORMING PHOTORESIST PATTERN USING THE SAME

(75) Inventors: Jin-A Ryu, Seoul (KR); Boo-Deuk Kim, Suwon-si (KR); Kyoung-Mi Kim, Gyeonggi-do (KR); Young-Ho Kim, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 11/033,154

(22) Filed: Jan. 12, 2005

(65) Prior Publication Data

US 2005/0158651 A1 Jul. 21, 2005

(30) Foreign Application Priority Data

Jan. 15, 2004 (KR) .................. 10-2004-0003012

(51) Int. Cl.
*C07F 7/02* (2006.01)
(52) U.S. Cl. .................. 556/412; 556/410; 430/141; 430/270.1; 430/311; 430/313
(58) Field of Classification Search .............. 556/412, 556/410; 430/141, 270.1, 311, 313
See application file for complete search history.

(56) References Cited

FOREIGN PATENT DOCUMENTS

| JP | 7-335603 | 12/1995 |
| JP | 2001-181585 | 7/2001 |
| JP | 2002-050778 | 2/2002 |

*Primary Examiner*—Samuel Barts
(74) *Attorney, Agent, or Firm*—Volentine Francos & Whitt, PLLC

(57) ABSTRACT

An adhesive compound for use during the formation of a photoresist film represented by the following chemical formula,

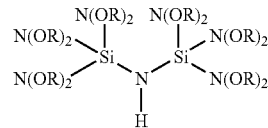

wherein R represents a photoacid generator is disclosed.

20 Claims, 3 Drawing Sheets

ADHESIVE COMPOUND AND METHOD FOR FORMING PHOTORESIST PATTERN USING THE SAME

BACKGROUND OF THE INVENTION

1. Field of the Invention

The present invention generally relates to an adhesive compound used to form a photoresist film on a substrate, and a method for forming a photoresist pattern using the same. More particularly, the present invention generally relates to an adhesive compound that reduces residual photoresist film on a substrate after a cleaning process, and a method for forming a photoresist pattern using the same.

A claim of priority is made to Korean Patent Application No. 2004-3012 filed on Jan. 15, 2004, the content of which is incorporated by reference.

2. Description of the Related Arts

As information processing devices have developed, semiconductor devices have also developed with higher degree of integration with rapid response speed. Hence, the technology for manufacturing the semiconductor devices has developed to improve integration, reliability, and response speed of the semiconductor devices. Accordingly, precision processing techniques, for example, a photolithography process, have become stricter.

In a conventional photolithography process, a photoresist film is formed on a substrate. Subsequently, predetermined portions of the photoresist film are removed by an exposing process and a developing process to form photoresist patterns, and then residual photoresist (developed photoresist) is then removed.

However, if properties of the substrate and the photoresist film are different, coating defects and pattern lifting may occur during a coating process and a pattern forming process, respectively. Conventionally, to improve the adhesive strength between the substrate and the photoresist film, hexamethyldisilazane (HMDS) represented by the following chemical formula (A), is coated on the substrate before the formation of the photoresist film.

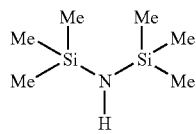

(A)

The HMDS turns the surface property of the silicon substrate from hydrophilic to hydrophobic, as illustrated in the following reaction equation (1). In particular, at a high temperature, silanol (Si—OH) reacts with the surface of the substrate to transform OH functional groups into OSiMe$_3$ functional groups. Therefore, the surface of the substrate loses its hydrogen bonding capabilities while gaining an affinity for organic materials; the photoresist adheres better to the substrate, and the adhesive strength between the substrate and the photoresist is enhanced. Also, a contact angle on the substrate increases.

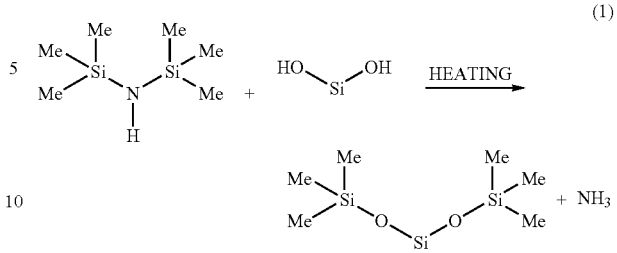

(1)

Thus, through the use of HMDS, coating defects and pattern shifts are prevented by increasing the adhesive properties of the photoresist compound.

However, when the adhesive strength between the substrate and the photoresist film on a positive photoresist is increased, exposed residual photoresist may remain on the substrate even after a cleaning process. The residual photoresist causes inaccurate patterns.

Korean Laid-open Patent Publication No. 2001-7330, published on Jan. 26, 2001, discloses for example, a method of using an adhesive layer with reduced pressure adhesive polymer. The adhesive layer does not include a low molecular weight oligomeric material. According to this method, the resist material is removed without leaving any organic contaminants on the surface of the substrate. However, the employment of the above-mentioned adhesive layer is not economical, and also requires an additional process step.

Thus, an adhesive compound with good adhesive strength and efficient photoresist film removability, and an adhesive compound that does not require an additional process or treatment step are required.

SUMMARY OF THE INVENTION

The present invention provides an adhesive compound for a photoresist film, which improves the adhesive strength between a substrate and a photoresist film.

In accordance with one aspect of the present invention, an adhesive compound for a photoresist film is represented by chemical formula (1)

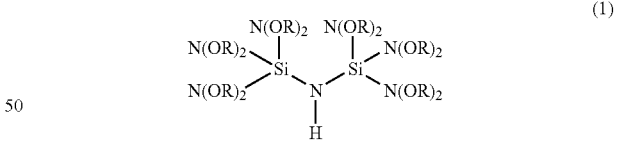

(1)

wherein R in chemical formula (1) is a photoacid generator.

The present invention also disclosed a method of forming an adhesive layer on a substrate by coating an adhesive compound represented by chemical formula (1)

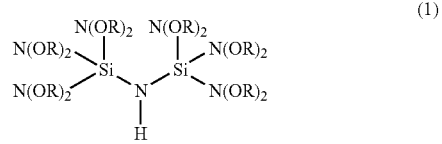

(1)

wherein R in chemical formula (1) is a photoacid generator, forming a photoresist film on the adhesive layer, exposing the photoresist film using a photo-mask, and forming a photoresist pattern by developing the exposed photoresist film.

Aspects of the present invention will become apparent by reference to the following detailed description in conjunction with the accompanying drawings wherein.

DESCRIPTION OF THE INVENTION

Figure 1:
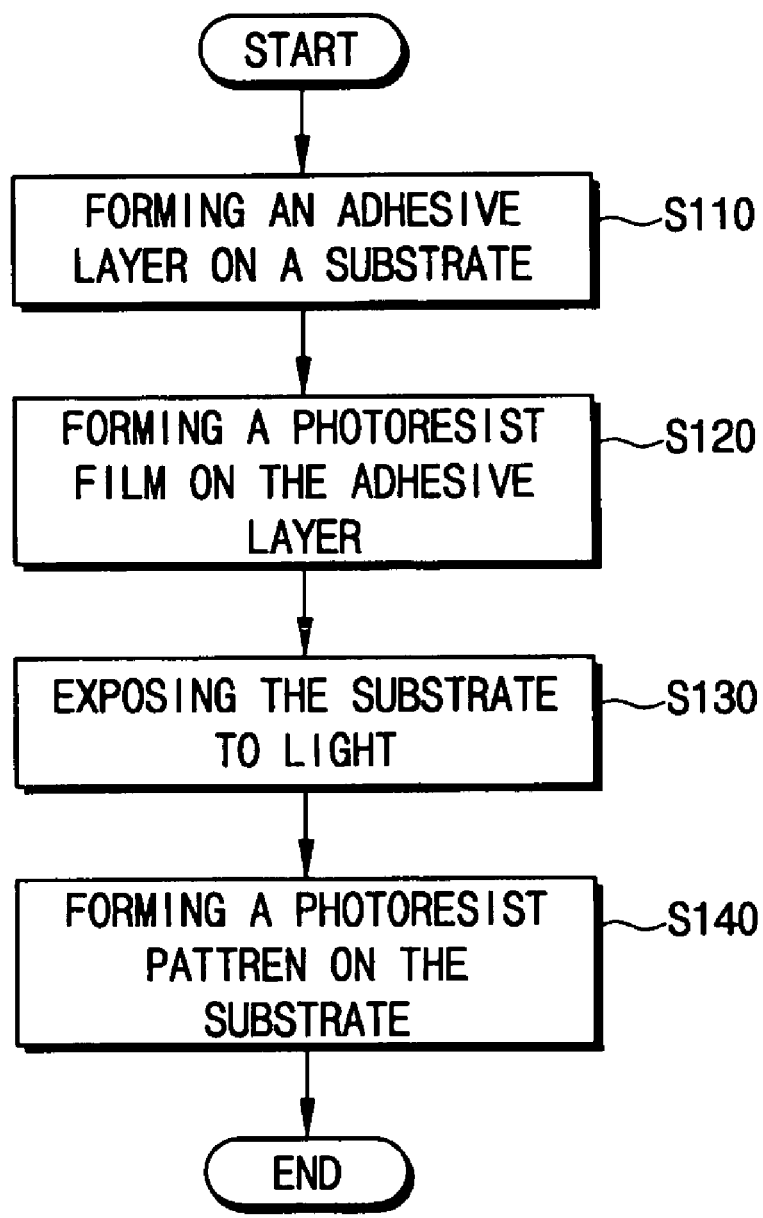
FIG. 1 is a flow chart to illustrate a method for forming photoresist patterns according to one embodiment of the present invention.

The present invention now will be described more fully with reference to the accompanying drawings, in which embodiments of the present invention are shown. The present invention may, however, be embodied in many different forms and should not be construed as limited to the embodiments set forth herein; rather, these embodiments provide teaching examples of the invention present. It will be understood that when an element such as a layer, a region or a substrate is referred to as being "on" or "onto" another element, it can be directly on the other element or intervening elements may also be present.

According to the present invention, an adhesive compound used in the formation of a photoresist film is provided. The adhesive compound is illustrated by the following chemical formula (1) wherein R represents a photoacid generator. Examples of the photoacid generator include a sulfonium salt, an acid imide, and a diazo-disulfone compound.

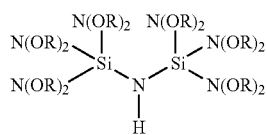
(1)

In particular, examples of the sulfonium salt include trimethyl sulfonium/trifluoromethane sulfonate, triphenyl sulfonium/trifluoromethane sulfonate, cyclohexyl methyl (2-oxo-cyclohexyl) sulfonium/trifluoromethane sulfonate, cyclopentyl methyl (2-oxo-cyclohexyl) sulfonium/trifluoromethane sulfonate, and 2-oxo-cyclohexyl methyl (2-norbonyl) sulfonium/trifluoro methane sulfonate.

Examples of the acid imide include trifluoromethyl sulfonyloxy-7-oxabicyclo[2,2,1]hept-5-ene-2,3-dicarboxylimide, trifluoromethyl sulfonyloxy bicyclo[2,2,2,]hept-5-ene-2,3-carboxylimide, and trifluoromethyl sulfonyloxy succinimide.

Examples of the diazo-disulfone compound include 1-cyclohexyl sulfonyl-1-(1,1-dimethylethyl sulfonyl) diazomethane, bis(1,1-dimethyl ethyl sulfonyl) diazomethane, bis(1-methylethyl sulfonyl) diazomethane, bis(cyclohexyl sulfonyl)diazomethane, bis(isopropylsulfonyl)diazomethane, bis(tert-butylsulfonyl)diazomethane, tert-butyl sulfonyl methyl sulfonyl diazomethane, and cyclohexyl sulfonyl ethyl sulfonyl diazomethane.

The adhesive compound may be synthesized, for example, by the following reaction equation (2).

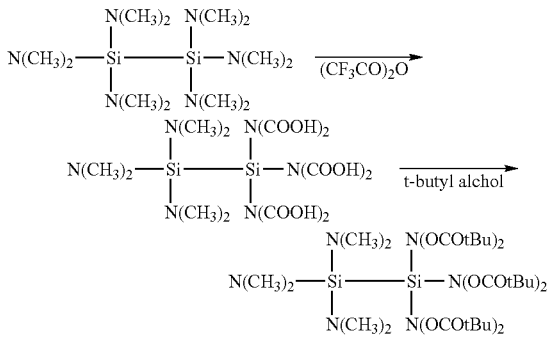

The above adhesive compound may be hydrophobic. However, the terminal o HMDS reacts with acid (H+) during an exposure process, and the terminal of HMDS changes from an —OH functional group to hydrophilic. The photoresist film does not attach to the transformed hydrophilic HMDS. Therefore, no photoresist residue remains on a substrate after a cleaning process. This process will be described referring to the following reaction equation (3).

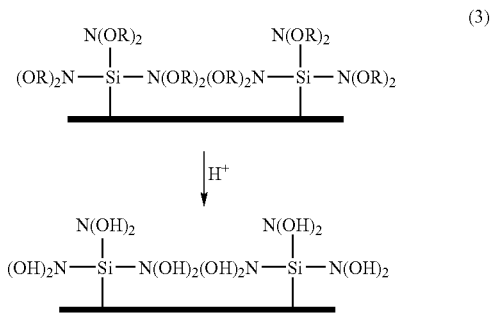
(3)

In reaction equation (3), R represents a photoacid generator (PAG). Referring to reaction equation (3), acid (H$^+$) is generated from the PAG or the acid is amplified by a reaction between the PAG acid and resin. The reaction within HMDS is maintained by the initially produced and amplified acid or the acid provided from the photoresist. That is, HMDS maintains its hydrophobic property prior to the exposure to increase the adhesive strength between the photoresist and the substrate during the formation of the photoresist film. However, after the exposure process, the adhesive layer is converted to a hydrophilic property by the acid reaction, and then the adhesive layer is removed along with the exposed photoresist by the developing process.

The present invention also provides a method for forming photoresist patterns using the adhesive compound. FIG. 1 is a flow chart illustrating the method for forming photoresist patterns according to one embodiment of the present invention.

Referring to step S110 of FIG. 1, an adhesive layer is formed using an adhesive compound of the present invention represented by the following chemical formula (1).

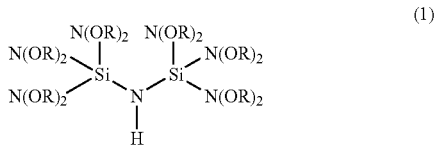

(1)

Subsequently in step S120, a photoresist film is formed on the adhesive layer. After the substrate is partially exposed in step S130, in step S140, photoresist patterns are formed by a developing process.

Each step will be described in further detail below. In step S110, an adhesive compound represented by the above chemical formula (1) is coated on a substrate to form an adhesive layer. Examples of the substrate include a silicon substrate and a liquid crystal display device (LCD). An underlying structure on which patterns are to be formed by a photolithography process is preferably formed on the substrate. Examples of the underlying structure include an oxide layer, a nitride layer, a silicon layer, and a metal layer.

Examples of the photoacid generator include a sulfonium salt, an acid imide, a diazo-disulfone compound, etc. In particular, examples of the sulfonium salt may include trimethyl sulfonium/trifluoromethane sulfonate, triphenyl sulfonium/trifluoromethane sulfonate, cyclohexyl methyl (2-oxo-cyclohexyl) sulfonium/trifluoromethane sulfonate, cyclopentyl methyl (2-oxo-cyclohexyl) sulfonium/trifluoromethane sulfonate, and 2-oxo-cyclohexylmethyl (2-norbonyl) sulfonium/trifluoro methane sulfonate.

Examples of the acid imide include trifluoromethyl sulfonyloxy-7-oxabicyclo[2,2,1]hept-5-ene-2,3-dicarboxylimide, trifluoromethyl sulfonyloxy bicyclo[2,2,2,]hept-5-ene-2,3-carboxylimide, and trifluoromethyl sulfonyloxy succinimide.

Examples of the diazo-disulfone compound include 1-cyclohexyl sulfonyl-1-(1,1-dimethylethyl sulfonyl) diazomethane, bis(1,1-dimethyl ethyl sulfonyl) diazomethane, bis(1-methylethyl sulfonyl) diazomethane, bis(cyclohexyl-sulfonyl)diazomethane, bis(isopropylsulfonyl)diazomethane, bis(tert-butylsulfonyl)diazomethane, tert-butyl sulfonyl methyl sulfonyl diazomethane, and cyclohexyl sulfonyl ethyl sulfonyl diazomethane.

The adhesive layer is preferably hydrophobic, which enhances the adhesive strength between the substrate and the subsequently formed photoresist film. The adhesive strength also prevents patterns from collapsing.

Then in step S120, a photoresist film is formed on the adhesive layer. The photoresist film is a positive or negative photoresist compound. For example, the photoresist film is preferably formed using the positive photoresist compound to remove the photoresist film and the adhesive layer at the same time by the exposure and developing processes. The coating is preferably implemented by any coating method including a spin coating method.

Subsequently, the substrate on which the photoresist film is formed is additionally baked. Moisture in the photoresist is removed by a curing process.

In step S130, the substrate and the photoresist film are exposed using a photo-mask. The photo-mask with a predetermined pattern is positioned over the photoresist film. Then, the photoresist film is exposed to light. Examples of the light include a G-line ray, an I-line ray, a krypton fluoride (KrF) laser, an argon fluoride (ArF) laser, an e-beam, or an X-ray. The solubility of the exposed photoresist film and the unexposed photoresist film are different.

According to the present embodiment, the adhesive layer is also exposed by the exposure process.

When a positive photoresist is used, the hydrophobic property of the photoresist film and the adhesive layer are converted into a hydrophilic property. The terminal of HMDS reacts with acid (H+) during the exposure process, and the terminal of HMDS changes into —OH functional groups and becomes hydrophilic. The photoresist film does not attach to the transformed hydrophilic HMDS. Therefore, no photoresist residue remains on the substrate after a cleaning process.

Then in step S140, the exposed substrate is developed to form photoresist patterns. For example, the exposed portion of the photoresist film (for the positive photoresist) and the adhesive layer are removed at the same time using a developing solution such as tetramethyl ammonium hydroxide.

Once the photoresist pattern is formed, various structures such as metal wirings, insulating layer patterns is preferably formed using the photoresist patterns as a mask through a post baking process and cleaning process.

According to the method described above, there are no residual photoresist remaining on the substrate after the cleaning process, and fine patterns can be accurately formed using the photoresist patterns. In addition, the above-described method requires no additional exposing and developing processes, and thus, the manufacturing cost is reduced.

The present invention now will be described more fully with reference to the present invention and a comparative example.

EXAMPLE

The process for forming photoresist patterns was simulated according to the above-described method for forming photoresist patterns. The adhesive layer was formed using the adhesive compound represented by the above chemical formula (1).

Figure 2A:
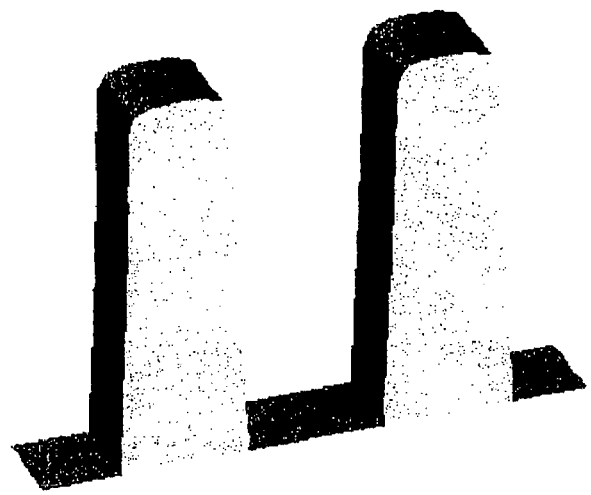
FIG. 2A is a simulated diagram of photoresist patterns formed using an adhesive layer according to one embodiment of the present invention.
Figure 2B:
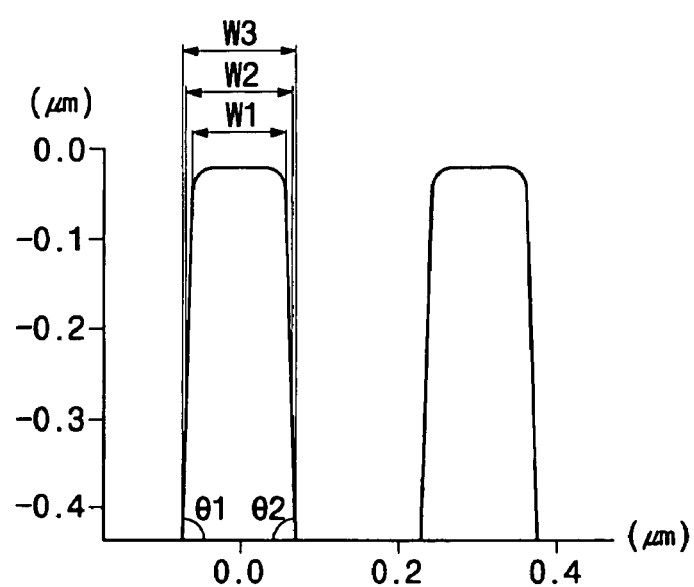
FIG. 2B is a graph of the simulated diagram illustrated in FIG. 2A.

FIG. 2A is a simulated diagram of the photoresist patterns formed using an adhesive layer according to an embodiment of the present invention, and FIG. 2B is a schematic graph of the simulated diagram illustrated in FIG. 2A.

Referring to FIG. 2B, W1, W2 and W3 respectively correspond to the pattern width at an upper portion of a photoresist. The pattern width below the upper portion of the photoresist and the pattern width at the portion contacting the lower structure are about 0.3 µm. In addition, a mean sidewall angle is the mean value of θ1 and θ2. Data including the pattern widths are shown in Table 1 below.

COMPARATIVE EXAMPLE

The process for forming photoresist patterns was simulated according to the same conditions and processes described in the above Example. Here, the adhesive layer was formed using the conventional adhesive compound represented by the above chemical formula (A).

Figure 3A:
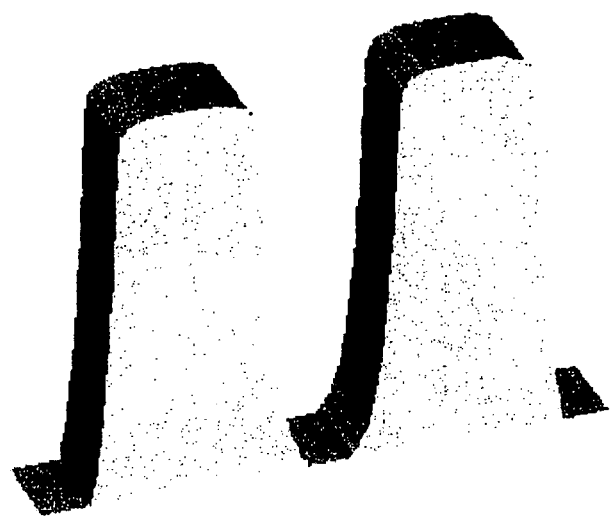
FIG. 3A is a simulated diagram of photoresist patterns formed by using an adhesive layer according to the conventional method.
Figure 3B:
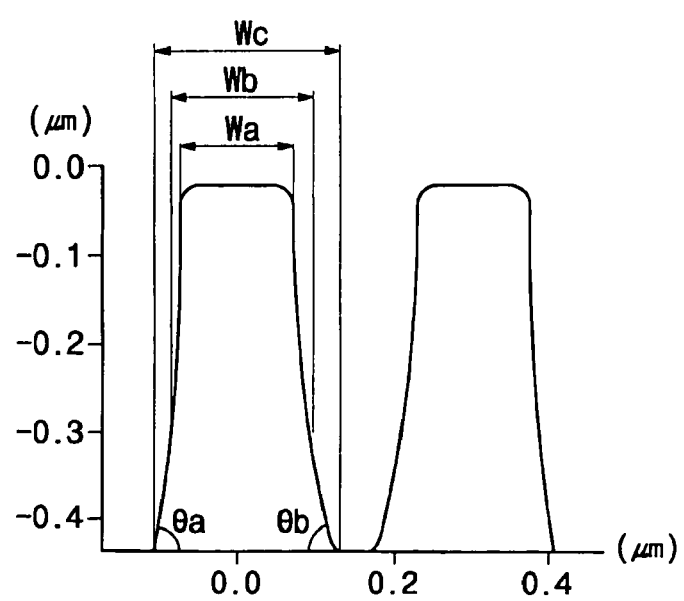
FIG. 3B is a schematic graph of the simulated diagram illustrated in FIG. 3A.

FIG. 3A is a simulated diagram of the photoresist patterns formed using an adhesive layer according to the conventional method, and FIG. 3B is a schematic graph of the simulated diagram illustrated in FIG. 3A.

Referring to FIG. 3B, Wa, Wb and Wc respectively correspond to the pattern width at an upper portion of the photoresist. The pattern width below the upper portion of the photoresist and the pattern width at the portion contacting the lower structure are about 0.3 µm. In addition, mean sidewall angle is the mean value of θa and θb. Data including the pattern widths are illustrated in Table 1.

TABLE 1

| Pattern width | Example | Comparative example |
|---|---|---|
| Upper portion width (μm) | 0.116 | 0.151 |
| Middle portion width (μm) | 0.134 | 0.182 |
| Lower portion width (μm) | 0.144 | 0.234 |
| Mean sidewall angle (°) | 87.7 | 86 |

Referring to Table 1, FIGS. 2A, 2B, 3A and 3B, good photoresist patterns including almost no residual photoresist can be formed when the photoresist patterns are formed according to the above Example.

According to the present invention, an adhesive compound is used to form an adhesive layer between a photoresist film and a substrate. An exposed photoresist film and the adhesive layer are simultaneously removed by a developing process.

Photoresist patterns having a high aspect ratio may be formed without performing an additional process or a treatment step. Further, various semiconductor devices having fine patterns may be formed by utilizing the photoresist patterns formed by the method of the present invention.

As described above, when the adhesive compound of the present invention is utilized to form an adhesive layer between the photoresist film and the substrate, semiconductor devices having a high reliability can be economically formed. Therefore, time and cost required to manufacture semiconductor devices may be reduced.

What is claimed is:

1. An adhesive compound represented by chemical formula (1)

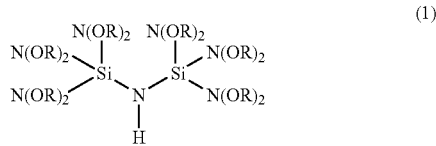

(1)

wherein R in chemical formula (1) is a photoacid generator.

2. The adhesive compound of claim 1, wherein the photoacid generator is a compound selected from the group consisting of a sulfonium salt, an acid imide, a diazo-disulfone compound, and a combination thereof.

3. The adhesive compound of claim 2, wherein the sulfonium salt is selected from the group consisting of trimethyl sulfonium/trifluoromethane sulfonate, triphenyl sulfonium/trifluoromethane sulfonate, cyclohexyl methyl (2-oxo-cyclohexyl) sulfonium/trifluoromethane sulfonate, cyclopentyl methyl (2-oxo-cyclohexyl) sulfonium/trifluoromethane sulfonate, and 2-oxo-cyclohexylmethyl (2-norbonyl) sulfonium/trifluoro methane sulfonate.

4. The adhesive compound of claim 2, wherein the acid imide is selected from the group consisting of trifluoromethyl sulfonyloxy-7-oxabicyclo[2,2,1]hept-5-ene- 2,3-dicarboxylimide, trifluoromethyl sulfonyloxy bicyclo[2,2,2,]hept-5-ene-2,3-carboxylimide, and trifluoromethyl sulfonyloxy succinimide.

5. The adhesive compound of claim 2, wherein the diazo-disulfone compound is selected from the group consisting of 1-cyclohexyl sulfonyl-1-(1,1-dimethylethyl sulfonyl) diazomethane, bis(1,1-dimethyl ethyl sulfonyl) diazomethane, bis(1-methylethyl sulfonyl) diazomethane, bis(cyclohexylsulfonyl)diazomethane, bis(isopropylsulfonyl) diazomethane, bis(tert-butylsulfonyl)diazomethane, tert-butyl sulfonyl methyl sulfonyl diazomethane, and cyclohexyl sulfonyl ethyl sulfonyl diazomethane.

6. The adhesive compound of claim 1, wherein the adhesive compound is hydrophobic.

7. A method for forming a photoresist pattern, comprising:
   forming an adhesive layer on a substrate by coating an adhesive compound represented by chemical formula (1),

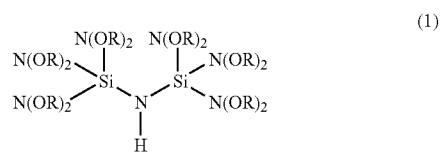

(1)

wherein R in chemical formula (1) is a photoacid generator on the substrate;
   forming a photoresist film on the adhesive layer;
   exposing the photoresist film using a photo-mask; and
   forming a photoresist pattern by developing the exposed photoresist film.

8. The method of claim 7, wherein the photoacid generator is a compound selected from the group consisting of a sulfonium salt, an acid imide, a diazo-disulfone compound, and a combination thereof.

9. The method of claim 7, wherein the sulfonium salt is selected from the group consisting of trimethyl sulfonium/trifluoromethane sulfonate, triphenyl sulfonium/trifluoromethane sulfonate, cyclohexyl methyl (2-oxo-cyclohexyl) sulfonium/trifluoromethane sulfonate, cyclopentyl methyl (2-oxo-cyclohexyl) sulfonium/trifluoromethane sulfonate, and 2-oxo-cyclohexylmethyl (2-norbonyl) sulfonium/trifluoro methane sulfonate.

10. The method of claim 7, wherein the acid imide is selected from the group consisting of trifluoromethyl sulfonyloxy-7-oxabicyclo[2,2,1]hept-5-ene-2,3-dicarboxylimide, trifluoromethyl sulfonyloxy bicyclo[2,2,2,]hept-5-ene-2,3-carboxylimide, and trifluoromethyl sulfonyloxy succinimide.

11. The method of claim 7, wherein the diazo-disulfone compound is selected from the group consisting of 1-cyclohexyl sulfonyl-1-(1,1-dimethylethyl sulfonyl) diazomethane, bis(1,1-dimethyl ethyl sulfonyl) diazomethane, bis(1-methylethyl sulfonyl) diazomethane, bis(cyclohexylsulfonyl)diazomethane, bis(isopropylsulfonyl)diazomethane, bis(tert-butylsulfonyl)diazomethane, tert-butyl sulfonyl methyl sulfonyl diazomethane, and cyclohexyl sulfonyl ethyl sulfonyl diazomethane.

12. The method of claim 7, wherein the adhesive layer is hydrophobic.

13. The method of claim 12, wherein a hydrophobic property of the adhesive layer is changed into hydrophilic though the exposure.

14. The method of claim 7, wherein the photoresist film is a positive photoresist compound.

15. The method of claim 7, wherein the photoresist film includes a hydrophobic photoresist compound.

16. The method of claim 7, further comprising:
   exposing the adhesive layer during the exposing process; and removing simultaneously the adhesive layer and the exposed photoresist film.

17. The method of claim 16, wherein the photoresist film includes a hydrophobic photoresist compound.

18. The method of claim 7, wherein the exposure is implemented by using a light selected from the group consisting of a G-line, an I-line, a krypton fluoride (KrF) laser, an argon fluoride (ArF) laser, an e-beam, and an X-ray.

19. The method of claim 7, wherein the development of the exposed substrate is implemented by using a developing solution of tetramethyl ammonium hydroxide (TMAH).

20. The method of claim 7, further comprising a step of baking the substrate after forming the photoresist film.

* * * * *